United States Patent [19]

Freers et al.

[11] 4,320,349
[45] Mar. 16, 1982

[54] THERMAL COUPLER FOR AMPLIFIER TEMPERATURE COMPENSATION

[75] Inventors: Alan W. Freers, Lombard; Daniel I. Pittenger, Libertyville, both of Ill.

[73] Assignee: Zenith Radio Corporation, Glenview, Ill.

[21] Appl. No.: 103,244

[22] Filed: Dec. 13, 1979

[51] Int. Cl.³ .............................................. H03F 3/04
[52] U.S. Cl. ...................... 330/66; 307/310; 330/289
[58] Field of Search ............... 330/66, 256, 266, 272, 330/289, 307; 307/310; 357/28, 81

[56] References Cited

U.S. PATENT DOCUMENTS

| | | | |
|---|---|---|---|
| 2,951,208 | 8/1960 | Barton | 330/273 |
| 3,128,431 | 4/1964 | Walker | 330/289 X |
| 4,151,547 | 4/1979 | Rhoades et al. | 357/81 |
| 4,207,481 | 6/1980 | Dobkin | 307/310 |
| 4,242,598 | 12/1980 | Johnson et al. | 307/310 |

OTHER PUBLICATIONS

Wakefield Semi-Conductor Heat Sinks and Thermal Products, Distributor Products Catalog No. 102 (1970 Edition), p. 17.

Primary Examiner—James B. Mullins
Attorney, Agent, or Firm—Jack Kail

[57] ABSTRACT

An easily installed thermal coupler inserted in the extruded section of a heat sink on which a transistor amplifier is mounted and positioned on a circuit board in thermal contact with diode biasing means coupled to the transistor amplifier. By thus thermally coupling the biasing means with the amplifier in a self-correcting, negative feedback loop, stable transistor operation is achieved and thermal runaway prevented. Employing a unitized metallic heat conducting member having a base plate including connecting studs for circuit board mounting and an upright member extending therefrom, the heat coupler may be used as either a heat sink or heat transfer device in carrying heat either out of or into the circuit board.

16 Claims, 5 Drawing Figures

THERMAL COUPLER FOR AMPLIFIER TEMPERATURE COMPENSATION

BACKGROUND OF THE INVENTION

This invention generally concerns an improved heat transfer device for use in a circuit board and more specifically is directed to improved transistor amplifier stabilization by the thermal coupling of the amplifier to transistor biasing means.

Semiconductor devices such as transistors are generally subject to operating instabilities due to temperature variations. Semiconductor temperature variations arise from either changes in the ambient temperature of the operating environment or due to power dissipation variations in the semiconductor device itself. Moderate increases in operating temperature of a semiconductor may result in variations in the output of the device. Extreme variations in operating temperature may result in the destruction of the semiconductor device if it is driven into a saturated conducting mode. This is due to the positive temperature conducting coefficient possessed by most semiconductors which produces an increase in device conductivity with increasing temperature. For example, the collector current of a transistor will usually increase with increased operating temperature. Thus, a transistor operating at high ambient temperatures and high heat dissipation will draw more collector current as the temperature of the collector junction increases. This rise in collector current causes a corresponding increase in collector junction temperature, and, under certain conditions, the process becomes cumulative and continues until the transistor is destroyed. For example, unless heat dissipation is provided for, it is possible that a silicon transistor which is operating at low heat dissipation at a $-55°$ C. will thermally run away when the ambient temperature is increased to 30° C.

The prior art discloses various approaches to controlling the thermal conductivity of a semiconductor device to avoid device destruction caused by thermal runaway. These approaches include DC feedback for biasing the transistor toward cutoff as the collector current increases, effective means for cooling the collector junction, and the temperature compensation of transistor bias by means of thermistors. The first approach generally involves a negative current feedback, similar to cathode bias in electron tubes, in which a resistor connected between emitter and ground provides a reverse bias which, as the collector current tends to increase with increasing temperature, changes the base current in such a way as to stabilize the collector current. This technique is especially useful for temperature compensation in certain types of transistor amplifiers such as audio frequency balanced or push-pull power amplifiers for class B operation wherein the transistors are to be maintained essentially at cutoff in a zero signal condition. This transistor biasing approach, while effective, generally requires the addition of a somewhat complex feedback control circuit to the existing semiconductor circuit layout thus increasing system complexity and cost. In addition, the semiconductor components in the negative feedback circuit must possess approximately the same temperature conducting characteristics as possessed by those components in the semiconductor circuit to which the bias correction is to be applied and the thermal environments of the temperature-sensitive components in both circuits must be as nearly identical as possible for proper control signal feedback.

One example of the use of a DC feedback signal for biasing a transistor toward cutoff as the collector current rises is disclosed in U.S. Pat. No. 2,951,208. This temperature controlled semiconductor bias circuit applies a voltage drop across a diode to the bases of a pair of coupled transistors in a standard transistor amplifier. The voltage applied to the transistor bases is negative relative to the voltage of the respective emitter electrodes of the transistors. An increase in the ambient temperature results in an increase in diode temperature and a decrease in diode resistance. This decrease in diode resistance will, in turn, produce a decrease in the voltage drop across the diode. In this manner, the forward bias voltage which is applied between the emitters of the coupled transistors and the respective base electrodes is decreased to decrease the collector current and maintain this current at a substantially constant, optimum value despite changes in ambient temperature. Should the temperature decrease, the reverse effect will prevail resulting in a stabilization in collector current. One embodiment of this thermal compensation circuit recites the thermal coupling of the temperature controlled, or responsive, impedance circuit element (diode) with at least one of the controlled transistors. While it is noted that this thermal coupling arrangement would compensate not only for large power dissipation but also for ambient temperature variations, no effective coupling means, or details thereof, is disclosed in the patent. Thus, this approach fails to correct for temperature differentials between the controlled semiconductor and the current biasing feedback device.

Another technique is to compensate for the temperature dependency of a transistor circuit element with another temperature-dependent circuit element such as a thermistor. In the case of a power transistor, it is desirable to have the thermistor coupled to the collector junction through a path with negligible thermal drop thus ensuring that the two temperature complementing semiconductor devices are operating at the same temperature. This approach, however, suffers from the limitations of the earlier-discussed invention in that no high efficiency thermal transfer device or system between temperature compensating semiconductor devices as currently available.

Still another approach to solving the problem of the dependence of semiconductor conductivity upon dissipation and ambient temperatures involves the use of cooling means to reduce the collector junction temperature. Thermal dissipation may be accomplished by refrigeration, forced-air cooling, and, more commonly, by radiation, conduction and convection to the surroundings. For a given temperature rise the amount of heat that can be dissipated is determined by the size of the device and, to a lesser extent, by its shape. In general, the semiconductor is thermally joined to a metal chassis or some other heat sink to increase thermal dissipation. Power transistors are typically clamped to the chassis with studs or screws to ensure a low thermal drop between the transistor and the chassis. A power transistor clamped to a heat sink may have a thermal rise above ambient temperature as low as 2° C. per watt.

One approach for improving the transfer of heat from a heat source to a heat sink is disclosed in U.S. Pat. No. 4,151,547. This approach involves the incorporation of a malleable, dimpled wafer between a semiconductor device such as a power transistor and an adjacent heat sink. By deforming the wafer so as to exactly overlap the surface of the heat sink in both size and shape, heat transfer from an operating semiconductor device to the heat sink is substantially enhanced. While this approach provides efficient thermal dissipation, it offers no active control of semiconductor operation and the increased accuracy associated therewith, as in the previously discussed bias current feedback systems.

Another approach to the stabilization of temperature-dependent transistor operation is presented in *Wakefield SemiConductor Heat Sinks and Thermal Products,* Distributor Products Catalog No. 102 (1970 Edition), page 17. Disclosed therein is a thermal equalizing link consisting of two clips bonded together and mounted to coupled transistors which form an output device such as an operational amplifier. This clip maintains the balanced transistors of the amplifier at the same case temperature providing for a more stable temperature-dependent amplifier output. This approach, however, is limited to thermal equalization of amplifier components and fails to address amplifier output control by a device or system which compensates for temperature variations of the amplifier as a unit.

The present invention, however, combines the semiconductor feedback bias current approach with efficient thermal coupling between the controlled semiconductor and the control feedback device in providing for stable semiconductor operation and preventing thermal runaway.

OBJECTS OF THE INVENTION

Accordingly, it is an object of the present invention to provide an improved system for stabilizing the performance of a semiconductor device.

It is another object of the present invention to provide an inexpensive, easily installed means for providing stable thermal operation for a transistor amplifier.

Still another object of the present invention is to prevent thermal runaway in a transistor by means of a self-correcting, negative feedback, current control loop.

A further object of the present invention is to provide a heat transfer device for a circuit board which may be used either as a heat sink or heat coupler in an application involving the transfer of heat either into or out of the circuit board.

Still another object of the present invention is to provide an inexpensive, easily installed, efficient means for thermally coupling a heat sink-mounted transistor amplifier with circuit board-mounted transistor biasing means such as a diode, a thermistor or any other appropriate semiconductor.

BRIEF DESCRIPTION OF THE DRAWINGS

The appended claims set forth those novel features believed characteristic of the invention. However, the invention itself as well as further objects and advantages thereof, will best be understood by reference to the following detailed description of a preferred embodiment taken in conjunction with the accompanying drawings, where like reference characters identify like elements throughout the various figures, in which:

DESCRIPTION OF THE PREFERRED EMBODIMENT

Figure 1:
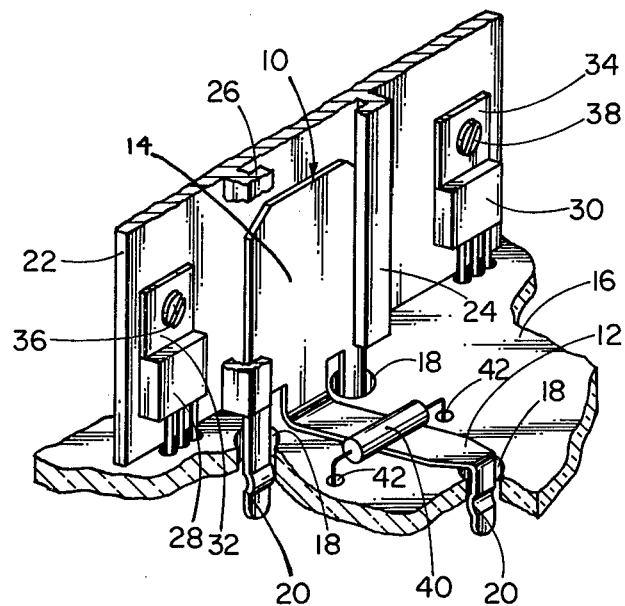
FIG. 1 is a perspective view of a conductor board to which a heat sink including attached transistor amplifier and semiconductor amplifier biasing means are mounted and thermally coupled in accordance with the heat transfer system of this invention.
Figure 2:
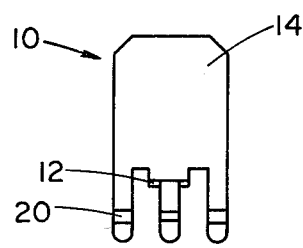
FIG. 2 is a front view of a thermal coupler for semiconductor temperature compensation in accordance with the preferred embodiment of the present invention.

Referring now to FIGS. 1 through 4, the invention will now be explained. In accordance with the present invention, the thermal coupler 10 in the improved thermal transfer system has a unitized metallic body comprised generally of a baseplate 12 and an upright member 14 extending from the baseplate. For circuit board mounting purposes, the baseplate 12 forms an angle of approximately 90° with upright member 14 in the preferred embodiment of the present invention. It is not essential that the angle between baseplate 12 and upright member 14 be equal to 90° for proper or even optimum operation of the present invention. The preferred angle is a function of printed circuit board component geometry and may vary from 0° to 360°. In the preferred embodiment of the present invention, upright member 14 is positioned at one end of baseplate 12 although the position of upright member 14 could as easily be at any point along the length of baseplate 12 depending upon the particular circuit board installation involved. Thermal coupler 10 is mounted to circuit board 16 through mounting holes 18 and held in position by means of mounting clips 20. Three mounting clips 20 are provided, with one positioned at the opposite end of baseplate 12 from which upright member 14 and baseplate 12 meet. The remaining two mounting clips extend downward from upright member 14 on each side of baseplate 12. With the latter two mounting clips facing in a direction opposite to that of the mounting clip located on the opposite end of baseplate 12, sufficient tension is applied to mounting clips 20 upon their insertion through mounting holes 18 to ensure a firm and stable thermal coupler installation on circuit board 16.

Also mounted to circuit board 16 is heat sink 22 containing extruded sections 24 and 26. The upright member 14 of thermal coupler 10 is inserted between extruded sections 24 and 26 which provide for the stable mounting of thermal coupler 10 on heat sink 22 and the efficient heat transfer between those two metallic structures. As shown by cutaway extruded section 26, thermal coupler 10 is inserted in the two slots defined by extruded sections 24 and 26 in a direction parallel to the surface of heat sink 22. To simplify the installation no mechanical coupling is required between thermal coupler 10 and heat sink 22 other than that provided by extruded sections 24 and 26 with thermal transfer efficiency increased by the use of a silicon-base, or other available, thermal conducting grease between thermal coupler 10 and heat sink 22. This insertion mounting technique significantly simplifies circuit board fabrication eliminating the need for complex and expensive connectors, component housings, etc. Heat sink 22 is installed on circuit board 16 by any of the more conventional mounting methods.

Positioned on heat sink 22 are transistors 28 and 30. Metal mounting plates 32 and 34 in combination with a thermal conducting grease ensure efficient thermal coupling between transistors 28 and 30 and heat sink 22. Transistors 28 and 30 are securely mounted on heat sink 22 by means of mounting screws 36 and 38, respectively. Thermal coupler 10 is positioned in extruded sections 24 and 26 so as to be equally distant from transistors 28 and 30. This configuration of heat sources, i.e., transistors 28 and 30, and heat sink, i.e., thermal coupler 10, ensures that the temperature of thermal coupler 10 closely approximates the average operating temperatures of transistors 28 and 30. In the preferred embodiment of the present invention, thermal coupler 10 is utilized in combination with a two-stage output amplifier, both transistors of which are mounted on heat sink 22. It is readily apparent that if more than one transistor stage is mounted on heat sink 22 all such heat sources should be equi-distant from thermal coupler 10 to ensure optimum heat transfer in this system. Indeed, several multi-stage transistor amplifiers may be accommodated by the present invention by thermally linking a single heat coupler 10 with each transistor in a given amplifier. Thermal coupler 10 is mounted to circuit board 16 by means of mounting clips 20 before the upright member 14 of thermal coupler 10 is inserted between extruded sections 24 and 26 of heat sink 22.

Figure 3:
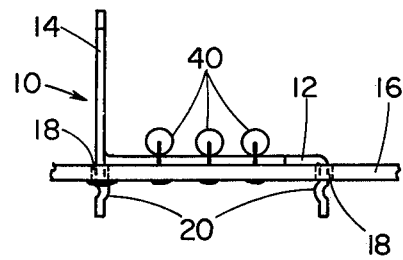
FIG. 3 is a side view of a thermal coupler for semiconductor temperature compensation in accordance with the preferred embodiment of the present invention in which is thermally coupled three transistor biasing diodes.
Figure 5:
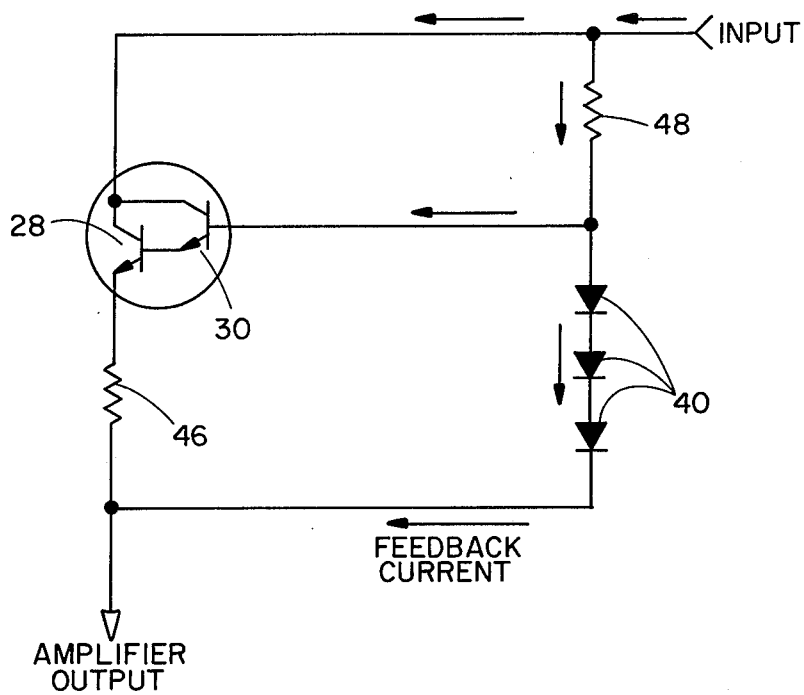
FIG. 5 is a schematic circuit diagram of a negative feedback bias control loop in which the feedback control current is provided to the emitter of the output transistor of a two-stage transistor amplifier by means of three diodes in series in accordance with a preferred embodiment of the present invention.

With thermal coupler 10 mounted to circuit board 16 feedback bias control diode 40 is then mounted to circuit board 16 through mounting holes 42 and is soldered in place. Diode 40 is positioned on circuit board 16 so as to be in thermal contact with thermal coupler 10 with a heat conducting grease applied between diode 40 and thermal coupler 10 for increased heat transfer. As shown in FIG. 3, a plurality of semiconductor transistor biasing means 40 may be thermally coupled to the baseplate 12 of thermal coupler 10 in the present thermal coupling system. In the preferred embodiment of the present invention, three diodes 40 are utilized for proper biasing of the emitter of the output transistor of the amplifier mounted on heat sink 22. Because of the positive temperature conductance coefficients of transistors 28 and 30 and diodes 40, in which conductivity increases with rising temperature, a negative feedback control loop is established for controlling the output current and operating temperature of the amplifier comprised of transistors 28 and 30. Referring to FIG. 5 there is shown a simplified schematic diagram of a negative feedback bias control loop circuit in which the present invention would have direct application. With diodes 40 carrying a DC current provided by a conventional current source (not shown) and coupled through a resistor 46 to the emitter of transistor 28, a reverse bias is developed across the resistor resulting in a reduction in the base current of output transistor 28 so as to stabilize collector current. Resistor 48 limits the current transmitted by diodes 40 and thus the voltage applied to the base of transistor 30. Because transistors 28 and 30 are thermally coupled to biasing diodes 40 and because both semiconductor devices have positive temperature conductance coefficients, the increase in operating temperature of transistors 28 and 30 resulting from increased current therein produces a similar increase in temperature and conductivity in diodes 40. The resulting negative feedback bias control loop results in a reduction in current and hence operating temperature of transistors 28 and 30. This not only stabilizes amplifier operation at various temperatures but also prevents transistor thermal runaway.

Thermal coupler 10 is preferably fabricated from a light metal possessing high thermal conductivity. Preferred thermal coupler materials would be aluminum, beryllium or copper, or any combination thereof. Beryllium oxide (BeO) possesses a thermal conductivity comparable to that of aluminum while exhibiting excellent electrical insulating characteristics.

Figure 4:
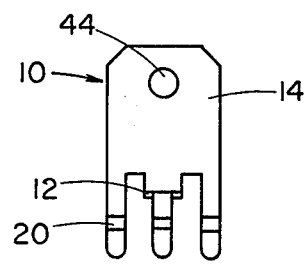
FIG. 4 is a front view of a thermal coupler in accordance with the preferred embodiment of the present invention in which is incorporated an aperture for mounting a semiconductor device.

FIG. 4 presents another embodiment of the present invention in which a mounting aperture 44 is incorporated in upright member 14 of thermal coupler 10. A mounting screw or other positioning device may then be inserted through mounting aperture 44 for positioning a semiconductor device directly on the thermal coupler 10. This provides more direct thermal coupling between the semiconductor device to be controlled and the biasing semiconductor in contact with the baseplate 12 of thermal coupler 10. However, the larger heat dissipation provided by heat sink 22 is not available in this embodiment although this reduction in heat dissipation may be more than offset by the enhanced thermal coupling offered by this configuration.

In addition to heat transfer by conduction through thermal coupler 10, the present heat transfer system also provides thermal transport by means of radiation and convection. Air flow in the printed circuit board environment will result in the transfer of heat from the upright member 14 of thermal coupler 10 to its baseplate 12. Similarly, radiation from upright member 14 will be incident upon baseplate 12. The present invention, therefore, offers the unique advantage of providing more efficient heat transfer utilizing all three available modes of thermal transport.

Finally, it is to be noted that the present invention provides efficient thermal coupling in a direction opposite to that available in prior art devices. Conductor board heat transfer devices currently available generally conduct heat away from or out of the conductor board. The present invention, however, directs heat back into or toward the conductor board in efficiently coupling a transistor amplifier with diode biasing means for regulating the output current of the amplifier. This is made possible by the unique interface between thermal coupler 10 and heat sink 22 which provides for efficient heat dissipation thus allowing thermal coupling back into the circuit, or conductor, board 16. The extruded interface between thermal coupler 10 and heat sink 22 not only provides efficient thermal transfer but also offers the advantages of ease of installation and reduced component cost.

There has thus been described a highly efficient thermal transport system involving a unique thermal coupler interfacing a heat sink-mounted amplifier with diode biasing means for controlling current output of amplifier transistors. By thermally coupling the output device with the control biasing feedback means, both of which have positive temperature conductance coefficients, stabilized operation of the output device is achieved and device failure caused by thermal runaway is prevented.

Changes in construction will occur to those skilled in the art and various apparently different modifications and embodiments may be made without departing from the scope of the invention. For example, the present invention is explained in terms of biasing the emitter of an NPN transistor in the output amplifier. However, the present invention will work equally as well by biasing the collector of a PNP output transistor. Also, while the present invention has been described primarily in terms of stabilizing the operation of an output, or power, transistor amplifier, the present invention has applicability wherever a negative feedback control loop between two semiconductors possessing similar temperature conductance coefficients is utilized. The matter set forth in the foregoing description and accompanying drawings is offered by way of illustration only and not as a limitation. The actual scope of the invention is intended to be defined in the following claims when viewed in their proper perspective against the prior art.

We claim:

1. In a semiconductor circuit on a conductor board including a first semiconductor output device and second semiconductor control device for regulating the operation of said first semiconductor device, said first and second semiconductor devices having conductivity characteristics which vary in substantially the same manner with temperature variations, a thermal transfer system for stabilizing the operation of said first semiconductor device comprising:
   a heat sink positioned on said conductor board, said heat sink being in thermal contact with said first semiconductor output device; and
   a thermal coupler including:
      a first base member having connecting means located on a lower surface of said base member for mounting said thermal coupler on said conductor board, said second semiconductor control device being in thermal contact with an upper surface of said base member; and a second member integrally connected to said base member and in thermal contact with said heat sink such that said first and second semiconductor devices operate at an approximately constant temperature differential.

2. A thermal transfer system according to claim 1 wherein the second member of said thermal coupler is connected to one end of the first base member of said thermal coupler with the angle between said first base member and said second member being approximately 90°.

3. A thermal transfer system according to claim 1 wherein the first semiconductor output device is a multi-stage transistor amplifier with each transistor stage mounted on said heat sink and said thermal coupler is in thermal contact with said heat sink such that the temperature of said thermal coupler closely approaches the average operating temperature of all transistors mounted on said heat sink.

4. A thermal transfer system according to claim 3 wherein the output transistor of the multi-stage transistor amplifier is an NPN-type transistor and the second semiconductor control device is a current-carrying diode connected to the emitter of said output transistor for proper biasing of said transistor amplifier.

5. A thermal transfer system according to claim 4 wherein said second semiconductor device is a thermistor.

6. A thermal transfer system according to claim 1, wherein said thermal coupler is formed of a metal possessing high thermal conductivity.

7. A thermal transfer system according to claim 1 wherein the first semiconductor output device is an integrated circuit.

8. A thermal transfer system according to claim 1 wherein said heat sink includes an extruded portion with said second member of said thermal coupler inserted in said extruded portion and held in position thereby.

9. In a semiconductor circuit on a conductor board including a multi-stage transistor amplifier in which the output transistor is an NPN-type transistor and a DC current-carrying diode connected to the emitter of said output transistor for proper biasing of said transistor amplifier, said transistor amplifier and biasing diode having conductivity characteristics which vary in substantially the same manner with temperature variation, a thermal transfer system for stabilizing the operation of said transistor amplifier comprising:
   a heat sink positioned on said conductor board, said heat sink being in thermal contact with said multi-stage transistor amplifier and including an extruded portion; and
   a thermal coupler formed of a metal possessing high thermal conductivity, said thermal coupler including:
      a base member having connecting means located on a lower surface of said base member for mounting said thermal coupler on said conductor board, said current-carrying diode being in thermal contact with an upper surface of said base member; and an upright member integrally connected to one end of said base member with the angle between said base member and said upright member being approximately 90° such that said upright member projects up from the surface of said conductor board when said base member is mounted on said conductor board, said upright member being in thermal contact with said heat sink and held in position by means of said extruded portion of said heat sink so that the temperature of said thermal coupler closely approaches the average operating temperature of all transistors mounted on said heat sink such that said transistor amplifier and said current-carrying diode operate at an approximately constant temperature differential.

10. A heat transfer device for stabilizing the operation of a first semiconductor device controlled by a direct-current carrying second semiconductor biasing device in a negative feedback current control loop wherein said first semiconductor device and second semiconductor device possess substantially the same temperature-dependent conductance characteristics with said second semiconductor device electrically coupled to said first semiconductor device to provide a direct-current to said first semiconductor device for biasing said first semiconductor device, said heat transfer device comprising:
   a first metal base plate of high thermal conductivity having a bottom and top surface, one end of said bottom surface including a mounting stud for fixedly positioning said heat transfer device on a circuit board with said second semiconductor device thermally coupled to the top surface of said metal base plate; and a second metal plate of high thermal conductivity integrally connected at one end to said base plate, the end of said second plate adjacent to said first base plate including a plurality of mounting studs extending downwardly beyond said base plate for fixedly positioning said heat transfer device on said circuit board, with said first semiconductor device or integrated circuit thermally coupled to a surface of said second metal plate and, in turn, thermally coupled to said second semiconductor biasing device.

11. A heat transfer device according to claim 10 wherein said second metal plate includes a mounting aperture for positioning said first semiconductor device on said second metal plate by means of a mounting screw.

12. A heat transfer device according to claim 10 wherein said second metal plate forms an angle of approximately 90° with said first metal base plate.

13. A heat transfer device according to claim 12 wherein said first and second metal plates are comprised of a metal possessing high thermal conductivity.

14. A heat transfer device according to claim 10 wherein said first semiconductor device is a multi-stage transistorized power amplifier with all of said transistors mounted on said second metal plate and said second semiconductor device is a diode conducting means.

15. A heat transfer device according to claim 14 wherein said second semiconductor device is a thermistor.

16. A heat transfer device for stabilizing the operation of a multi-stage transitorized power amplifier controlled by a direct-current carrying diode conducting means in a negative feedback current control loop wherein said power amplifier transistors and diode conducting means possess substantially the same temperature-dependent conductance characteristics with said diode conducting means electrically coupled to the output transistor of said multi-stage transistorized power amplifier to provide a direct-current for biasing the collector and base electrodes of said output transistor in a reverse direction and for biasing the base and emitter electrodes of said output transistor in a forward direction, said heat transfer device comprising:

a metal base plate of high thermal conductivity having a bottom and top surface, one end of said bottom surface including a mounting stud for fixedly positioning said heat transfer device on a circuit board with said diode conducting means thermally coupled to the top surface of said metal base plate; and an upright metal plate of high thermal conductivity formed by bending a single metal member at an angle of approximately 90° thus forming said metal base plate and said upright metal plate, said upright metal plate including a mounting aperture for positioning said transistors of said multi-stage transistorized power amplifier on said upright metal plate by means of mounting screws and including a plurality of mounting studs positioned on the end of said upright metal plate adjacent to said base plate and extending downwardly beyond said base plate for fixedly positioning said heat transfer device on said circuit board with said multi-stage transistorized power amplifier thermally coupled to a surface of said upright metal plate and, in turn, thermally coupled to said diode conducting means.

* * * * *